(12) United States Patent
Wang et al.

(10) Patent No.: US 8,936,960 B1
(45) Date of Patent: Jan. 20, 2015

(54) METHOD FOR FABRICATING AN INTEGRATED DEVICE

(71) Applicant: United Microelectronics Corp., Hsin-Chu (TW)

(72) Inventors: Kuan-Yu Wang, New Taipei (TW); Hui-Min Wu, Hsinchu County (TW); Kun-Che Hsieh, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 73 days.

(21) Appl. No.: 13/933,135

(22) Filed: Jul. 2, 2013

(51) Int. Cl.
*H01L 21/00* (2006.01)
*H01L 21/4763* (2006.01)
*H01L 21/44* (2006.01)
*B81C 1/00* (2006.01)

(52) U.S. Cl.
CPC .................................. *B81C 1/00682* (2013.01)
USPC ............. 438/50; 438/618; 438/622; 438/652; 438/669

(58) Field of Classification Search
None
See application file for complete search history.

(56) References Cited

U.S. PATENT DOCUMENTS

| | | | |
|---|---|---|---|
| 7,299,538 B2 * | 11/2007 | Tactic-Lucic | 29/622 |
| 8,183,651 B2 * | 5/2012 | Takagi et al. | 257/415 |
| 8,227,876 B2 * | 7/2012 | Nunan et al. | 257/414 |
| 8,709,264 B2 * | 4/2014 | Jahnes et al. | 216/2 |
| 8,829,628 B2 * | 9/2014 | Hsu et al. | 257/415 |
| 2006/0205106 A1 * | 9/2006 | Fukuda et al. | 438/52 |
| 2007/0281381 A1 * | 12/2007 | Ayazi | 438/52 |
| 2012/0175715 A1 * | 7/2012 | Hammond et al. | 257/415 |
| 2013/0228881 A1 * | 9/2013 | Mohanakrishnaswamy et al. | 257/417 |
| 2014/0062619 A1 * | 3/2014 | Montanya Silvestre et al. | 333/186 |

* cited by examiner

*Primary Examiner* — Scott B Geyer
(74) *Attorney, Agent, or Firm* — Winston Hsu; Scott Margo

(57) ABSTRACT

A method for fabricating an integrated device includes the following steps. First, a multi-layered structure is formed on a substrate, wherein the multi-layered structure is embedded in a lower isolation layer. Then, a bottom conductive pattern and a top conductive pattern are formed on a top surface of the lower isolation layer, wherein the top conductive pattern is on a top surface of the bottom conductive pattern. Afterwards, portions of the top conductive pattern are removed to expose portions of the bottom conductive pattern. Subsequently, an upper isolation layer is deposited on the lower isolation layer so that the upper isolation layer can be in direct contact with the portions of the bottom conductive pattern. Finally, portions of the lower isolation layer and the upper isolation layer are removed so as to expose portions of the substrate.

19 Claims, 10 Drawing Sheets

METHOD FOR FABRICATING AN INTEGRATED DEVICE

BACKGROUND OF THE INVENTION

1. Field of the Invention

The present invention relates generally to the field of integrated devices, and more particularly to a method for integrating at least one micro electro mechanical system (MEMS) device with one or more complementary metal oxide semiconductor (CMOS) devices.

2. Description of the Prior Art

A micro electro mechanical system (MEMS) is a tiny device with both electronic and mechanical functions. The MEMS can include accelerometers, gyroscope, magnetic sensors, pressure sensors, microphones, humidity sensors, temperature sensors, chemical sensors, biosensors, inertial sensors, as well as other well known MEMS common utilizations. In the past decades, the MEMS have been further integrated with CMOS such that integrated microelectronics including both MEMS and CMOS can be obtained.

Along with the progress in the semiconductor industry, research and development in integrated microelectronics have continued to produce astounding progress in the CMOS and the MEMS technologies. The MEMS, however, continue to rely upon conventional process technologies. In layman's terms, the microelectronic ICs are the "brains" of an integrated device that provide the decision-making capabilities, whereas the MEMS are the "eyes" and "arms" that provide the ability to sense and control the environment. Some examples of the widespread application of these technologies are switches in radio frequency (RF) antenna systems and accelerometers in sensor-equipped game devices. Though they are not always easily identifiable, these technologies are becoming ever more prevalent in society every day.

Although highly successful, the ICs and in particular the MEMS still have limitations. With the continuous reduction of the size of the MEMS, the residual stress gradient existing in the layers of the MEMS has become more predominant and often causes vertical curling in the sub-structures of the MEMS. For example, MEMS may be a multi-layered structure made of several metal layers, such as Al and TiN, and dielectric layers, such as $SiO_2$. Due to different thermal expansion coefficients (TEC) of metals and dielectric materials, during the fabrication process for the integrated microelectronics, stresses may be generated and accumulated on the interfaces among the metal layers and/or the dielectric layers. This phenomenon causes serious deformation of the MEMS and inevitably reduces the reliability of the corresponding integrated microelectronics. Consequently, how to avoid the deformation of the MEMS is still an important issue in the field, in order to improve the performances of the corresponding integrated microelectronics.

SUMMARY OF THE INVENTION

One object of the present invention is therefore to provide a method for fabricating an integrated device that avoids the above-described drawbacks.

According to one exemplary embodiment of the present invention, a method for fabricating an integrated device is provided and includes the following steps. First, a multi-layered structure is formed on a substrate, wherein the multi-layered structure is embedded in a lower isolation layer. Then, an upper isolation layer including a bottom conductive pattern and a top conductive pattern is formed on the top surface of the lower isolation layer, wherein the top conductive pattern is formed on the top surface of the bottom conductive pattern. Afterwards, portions of the top conductive pattern are removed to expose portions of the bottom conductive pattern. Subsequently, an upper isolation layer is deposited on the lower isolation layer so that the upper isolation layer can be in direct contact with the portions of the bottom conductive pattern. Finally, portions of the lower isolation layer and the upper isolation layer are removed so as to expose portions of the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
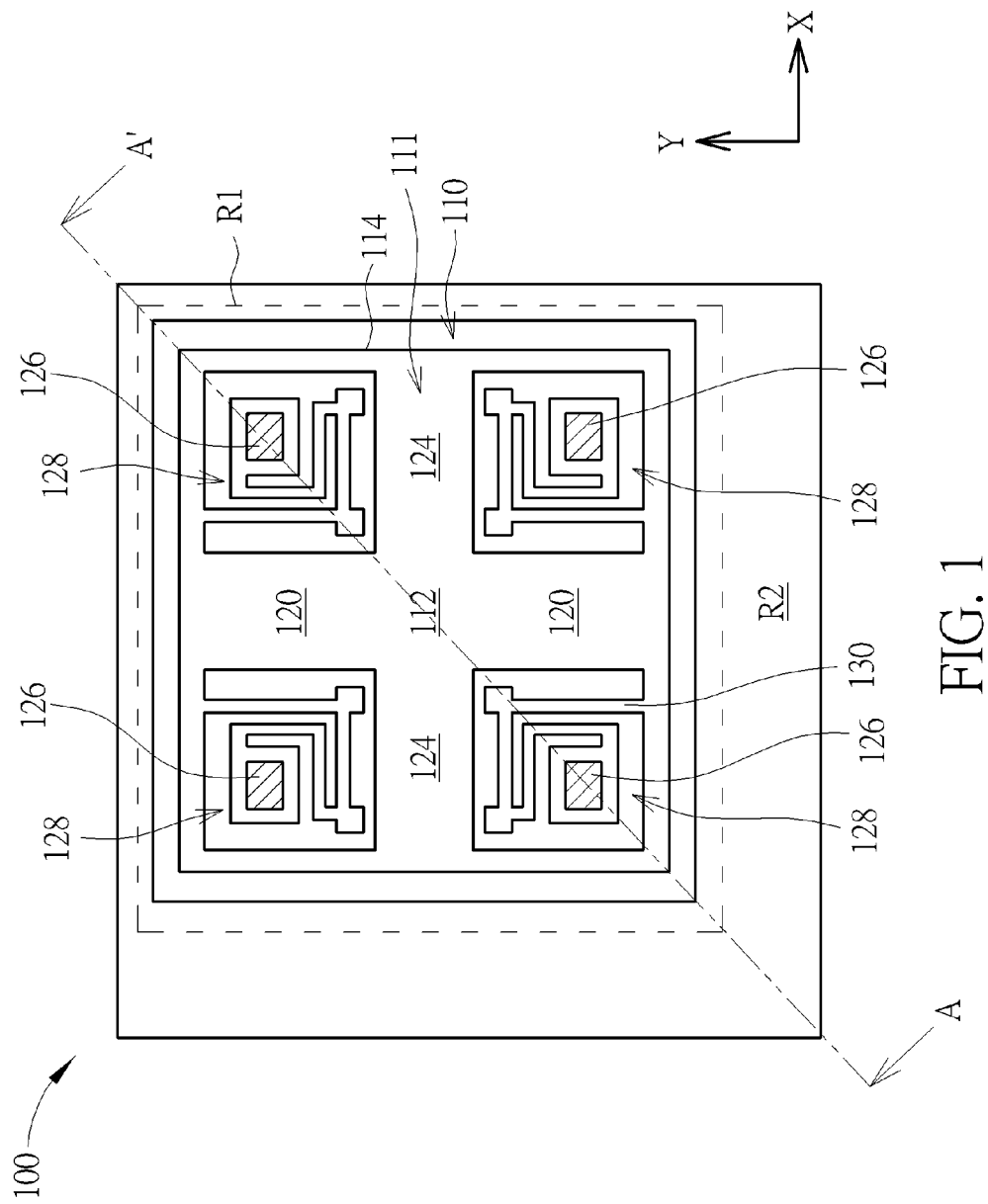
FIG. 1 is a schematic top view of an integrated device.

To provide a better understanding of the present invention, preferred exemplary embodiments will be described in detail. The preferred exemplary embodiments of the present invention are illustrated in the accompanying drawings with numbered elements.

It should be noted that all the figures are diagrammatic. Relative dimensions and proportions of parts of the drawings have been shown exaggerated or reduced in size, for the sake of clarity and convenience in the drawings. The actual dimensions and proportions of parts of the drawings may be modified in accordance with the specific requirements.

Please refer to FIG. 1, which is a schematic top view of a finished integrated device after a fabrication process of the present invention. As shown in FIG. 1, an integrated device 100 is provided. The integrated device 100 includes a micro electro mechanical system (MEMS) device 110 and a complementary metal oxide semiconductor (CMOS) (not shown) respectively disposed in a MEMS region R1 and a CMOS region R2. According to this embodiment, the periphery of the MEMS region R1 is fully surrounded by the CMOS region R2, but not limited thereto. More precisely, the MEMS device 110 in the integrated device 100 includes a movable structure 111, a frame 114, and a suspension structure 128. The movable structure 111 may comprise an accelerometer, a gyroscope, an electrical contact, a mirror, an optical switch, a add-drop multiplexer, an optical radiation modulator, a cantilever with AFM tip, a probe storage device, a micro-tweezers, a precision MEMS-based positioning stage, an electrostatic actuator, an electromagnetic actuator, a piezoelectric actuator, a thermal actuator, or a valve. Preferably, the movable structure 111 disclosed in this embodiment is an accelerometer including a proof mass 112 and a plurality of sense fingers 120 and 124 used to sense acceleration along the X and Y axes. As shown in FIG. 1, the proof mass 112 is supported from the frame 114 by the sense fingers 120 and 124, which are surrounded by fixed fingers (not shown), while the frame 114, in turn, is attached to the suspension structure 128. Each of the suspension structures 128 includes a fixed anchor 126 attached to a substrate (not shown) and a spring 130 compliant in a predetermined direction or plane. During the operation of the integrated device 100, for example, when the MEMS device 110 experiences a force applied to it in an XY plane (i.e. the plane parallel to the major surface of a substrate underneath the MEMS device), the proof mass 112 along with the sense fingers 120 and 124 supported by the suspension structure 128 will be displaced from its neutral position. Under the displacement of the proof mass 112, a restoring force proportional to the displacement of the movable structure with respect to the neutral position can be generated by the springs 130 in response to the applied force. As a result, the distance between the sense fingers 120 and 124 and the adjacent fixed fingers is changed, thus changing the capacitance between these fingers. This change in capacitance is registered by the sense circuitry (not shown) and converted to an output signal representative of the acceleration along these axes. Similarly, an acceleration along a Z axis (i.e. the direction orthogonal to the major surface of the substrate underneath the MEMS device) may also be sensed in an analogous manner by registering the change in capacitance along the Z axis.

The integrated device described therein can be achieved through a number of different fabrication ways. One such way is disclosed in the following paragraph and is depicted in FIG. 2 to FIG. 6

Figure 2:
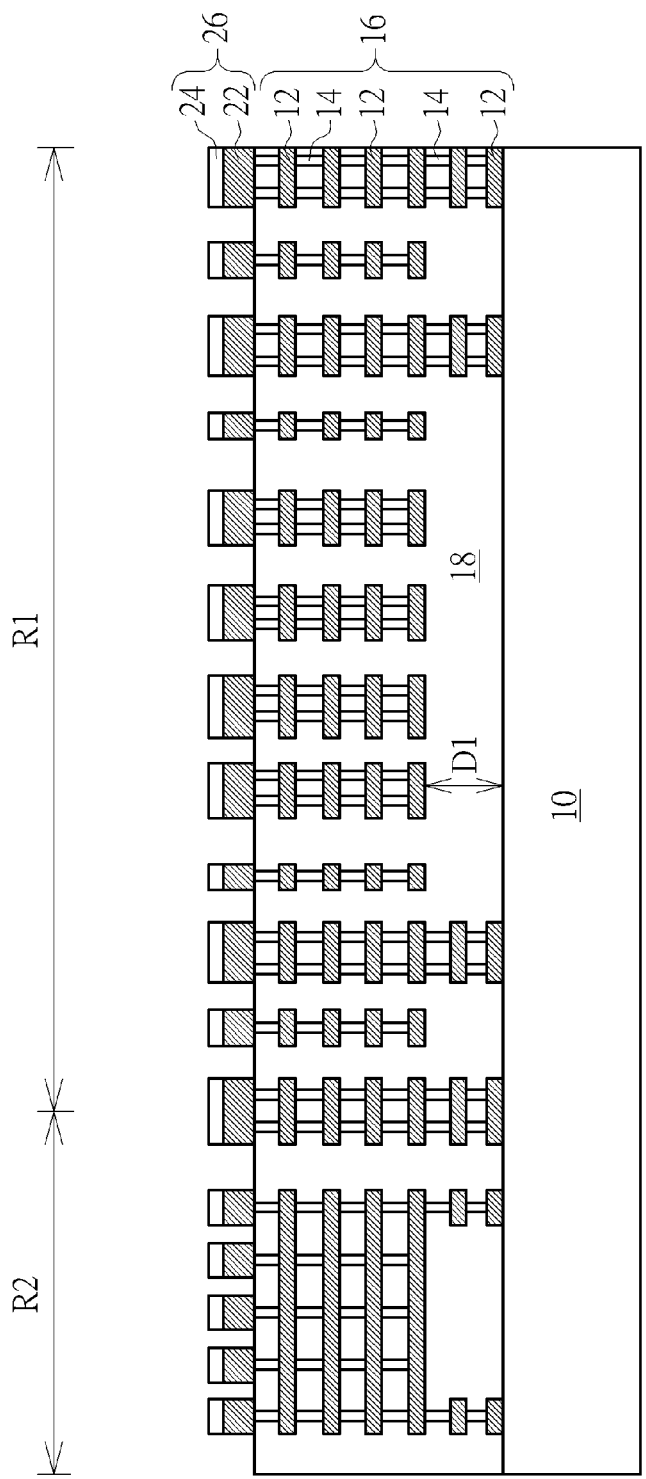
FIG. 2 to FIG. 6 are schematic cross sectional diagrams corresponding to a line A-A' of FIG. 1, which shows a method for fabricating the integrated device according to a first exemplary embodiment of the present invention.

Please refer to FIG. 2 to FIG. 6. FIG. 2 to FIG. 6 are schematic cross sectional diagrams showing a method for fabricating the integrated device according to a first exemplary embodiment of the present invention. More precisely, the structures shown in FIG. 2 to FIG. 6 correspond to the structure taken along a line A-A' of FIG. 1. Referring to FIG. 1 and FIG. 2, at the beginning of the fabrication process, a multi-layered structure 16 is formed on a semiconductor substrate 10 within the MEMS region R1 and the CMOS region R2. The semiconductor substrate 100 may include a Si substrate, a GaAs substrate, a silicon-on-insulator (SOI) substrate, a compound semiconductor-on-silicon substrate or other suitable substrates, but not limited thereto. The multi-layered structure 16 is embedded in a lower isolation layer 18 composed of suitable electrical insulation materials, such as silicon oxide. Additionally, some portions of the multi-layered structure 16 are spaced apart from a main surface of the substrate 10 with a first distance D1. More precisely, the multi-layered structure 16 includes a plurality of lower conductive patterns 12 and a plurality of conductive vias 14 stacked alternately with one another. The lower conductive patterns 12 and the conductive vias 14 may be conductive materials respectively made of aluminum and tungsten, but not limited thereto. In this configuration, conductive vias 14 may electrically connect two adjacent lower conductive patterns 12 if required. In addition, several semiconductor devices (not shown), such as CMOS devices, may be formed on the substrate 10 and electrically connected to one another through the lower conductive patterns 12 and the conductive vias 14 within the CMOS region R2. That is to say, the lower conductive patterns 12 within the CMOS region R2 may serve as interconnection structures.

Still referring to FIG. 2, in a next step, at least two layers of conductive materials (not shown) are formed on the top surface of the lower isolation layer 18. Subsequently, at least a photolithographic and an etching process are carried out. The conductive materials can be patterned during these processes and an upper conductive pattern 26 is therefore formed on the top surface of the lower isolation layer 18. Preferably, the location of the upper conductive pattern 26 may correspond to that of the lower conductive patterns 12. More precisely, the upper conductive pattern 26 includes a bottom conductive pattern 22 and a top conductive pattern 24. The composition of the bottom conductive pattern 22 includes aluminum, copper, tungsten or other suitable materials with outstanding conductivity, while the composition of the top conductive pattern 24 includes titanium, titanium nitride, tantanum or tantanum nitride, but not limited to thereto. According to this embodiment, the bottom conductive pattern 22 and the top conductive pattern 24 are respectively composed of Al and TiN, but not limited to thereto.

Figure 3:
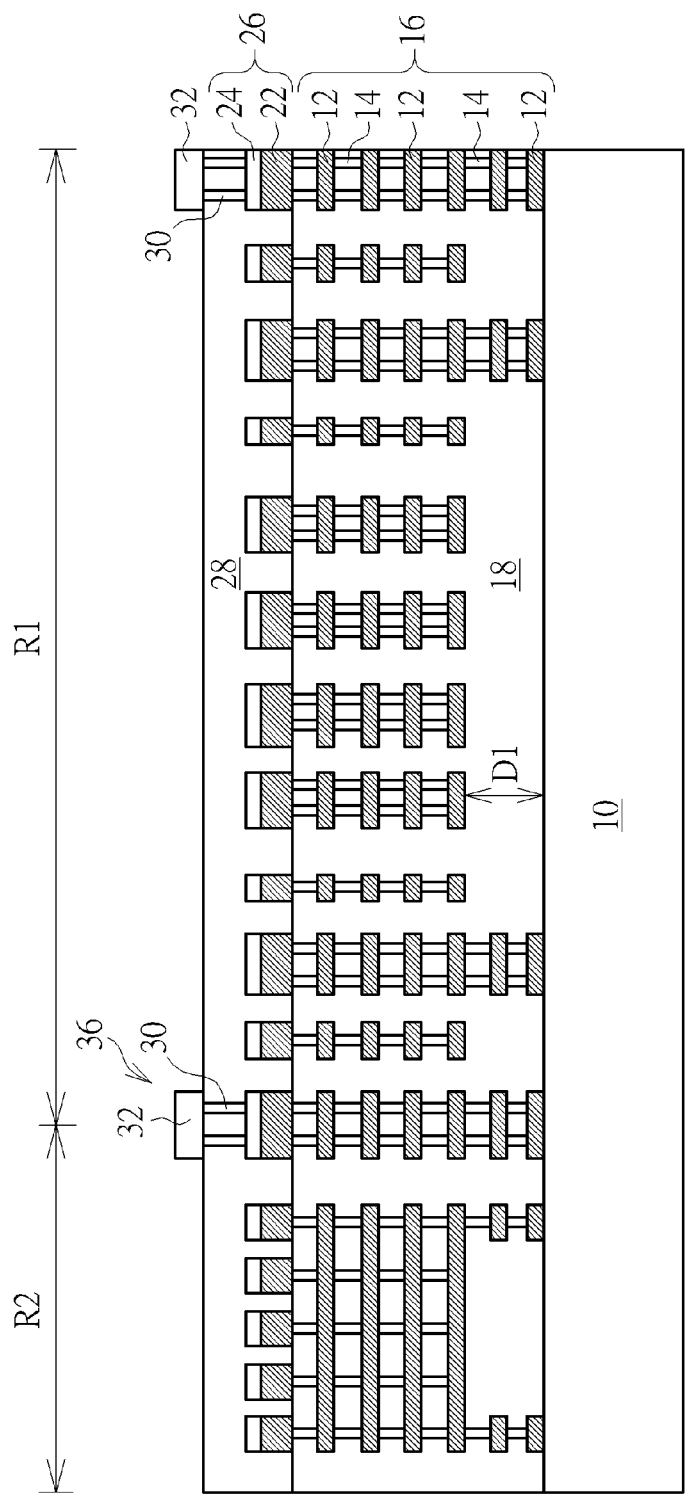

Please refer to FIG. 3. After the formation of the upper conductive pattern 26, another electrical insulation layer is formed to cover the entire upper conductive pattern 26. For example, an upper isolation layer 28 is formed on the upper conductive pattern 26 and fills up the space in the upper conductive pattern 26. The composition of the upper isolation layer 28 is preferably similar to or the same as that of the lower isolation layer 18 such that the upper isolation layer 28 and the lower isolation layer 18 are able to be removed during a subsequent etching process. Then, conductive vias 30 made of conductive materials, such as tungsten, are formed in the upper isolation layer 28 on the interface between the MEMS region R1 and the CMOS region R2. Subsequently, an isolation pattern 32 made of electrical insulation materials, such as un-doped polysilicon or amorphous silicon, is formed to cover the conductive vias 30. It should be noted that a portion of the multi-layered structure 16 together with the upper conductive pattern 26, the conductive vias 30 and the isolation pattern 32 on the interface between the MEMS region R1 and the CMOS region R2 can comprise a protection structure 36. The protection structure 36 can protect the lower isolation layer 18 within the CMOS region R2 from removing during subsequent etching process.

Figure 4:
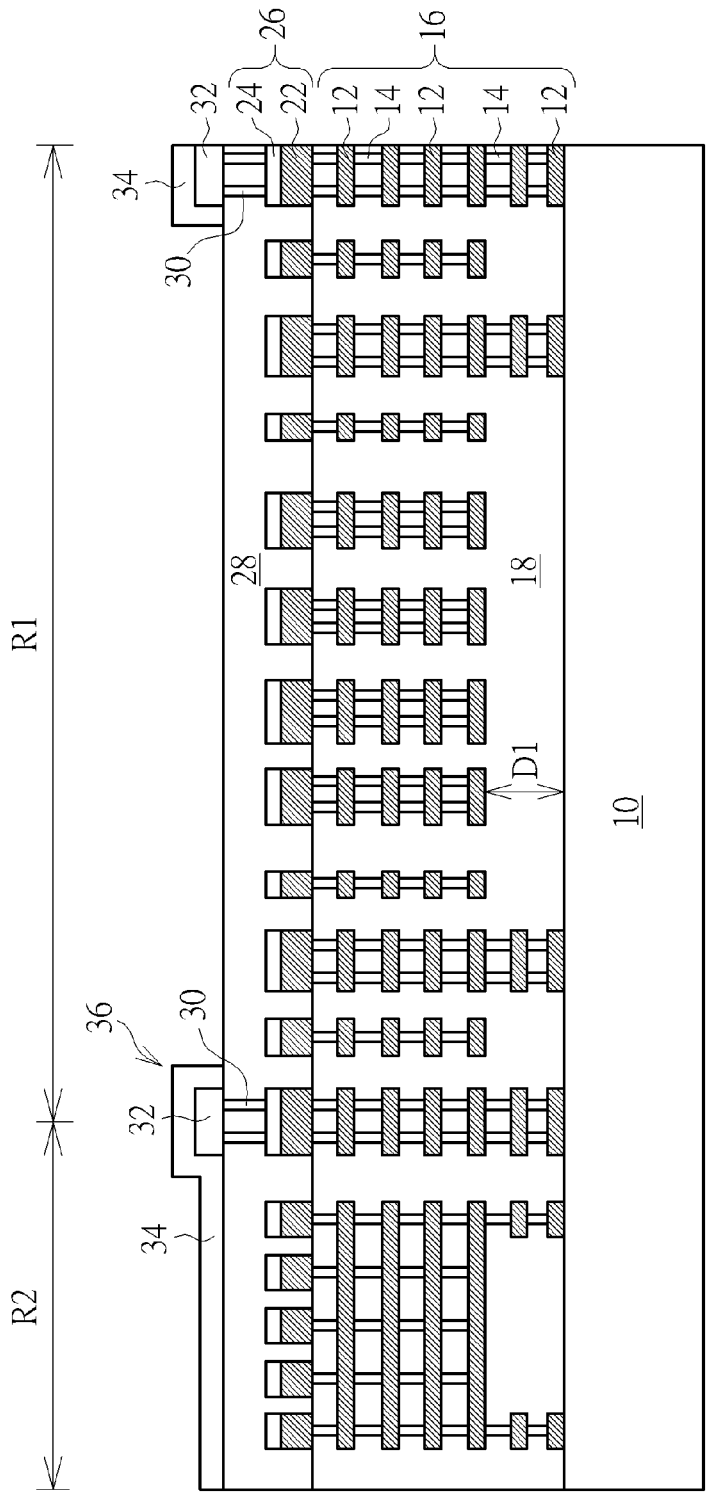
Figure 5:
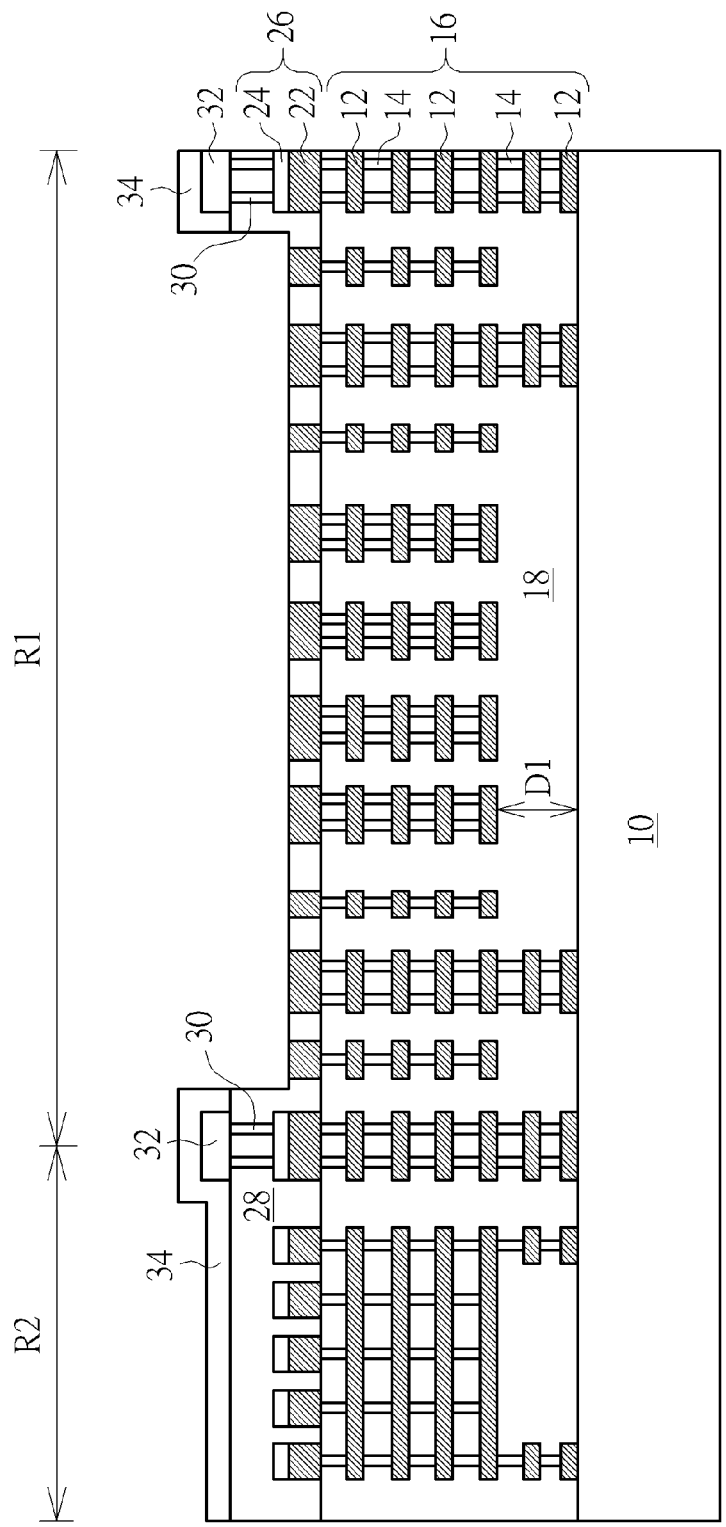
Figure 6:
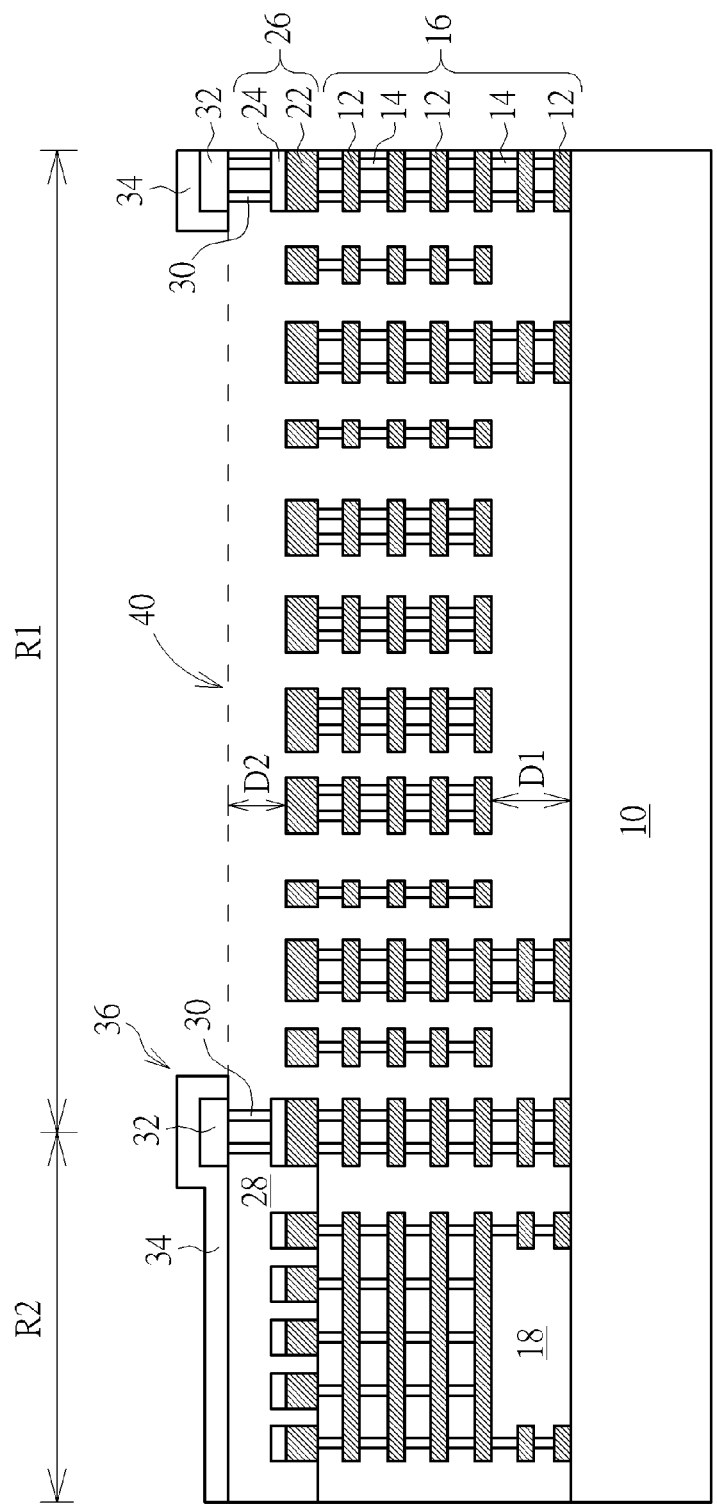

Please refer to FIG. 4 to FIG. 6. In FIG. 4, a mask layer (not shown) is then formed on the upper isolation layer 28 and the isolation pattern 32 through a deposition process. Afterwards, a mask 34 is formed through patterning the mask layer and at least portions of the upper isolation layer 28 are exposed from the mask 34. In FIG. 5 and FIG. 6, by using the mask 34 as an etch mask, a series of etching processes are then carried out to sequentially remove the upper isolation layer 28, the top conductive pattern 24 and the lower isolation layer 18 within the MEMS region R1. More precisely, the etching processes may include a deep reactive ion etching (DRIE) process, a plasma etching process, a gas etching process, or a wet etching process, but not limited thereto. For example, when the composition of both the upper isolation layer 28 and the lower isolation layer 18 is silicon oxide and that of the top conductive pattern 24 is titanium nitride, a dry etching process with HF etchants may be carried out first until the top conductive pattern 24 is exposed. Afterwards, another dry etching process is further carried out to remove the top conductive pattern 24. Finally, as shown in FIG. 6, still another etching process, such as a DRIE process or a HF vapor etching process, is performed to remove the whole upper isolation layer 28 and lower isolation layer 18 within the MEMS region R1 such that a main structure of the MEMS device 110 as shown in FIG. 1 can be obtained. It should be noted that the protection structure 36 can protect both the upper and lower isolation layer 28 and 18 from removing during the above etching process.

Referring back to FIG. 1 and FIG. 6, the movable structure 111 shown in FIG. 1 is therefore formed after the removal of the whole lower isolation layer 18 within the MEMS region R1. More precise, the bottom of the movable structure 111 is spaced apart from the main surface of the underneath substrate 10 with a first distance D1, while the top of the movable structure 111 is spaced apart from the bottom surface of the mask 34 with a second distance D2. In this configuration, the movable structure 111 enables the integrated device 100 to sense a force applied to it. However, even though the MEMS device 110 is fabricated as following the steps of the above process, a deformation of the movable structure 111 still occurs slightly. In other words, the second distance D2 and/or the first distance D1 are not equal within the entire MEMS region R1. The surface topography of the finished structure is measured and depicted in the diagram shown in FIG. 7.

Figure 7:
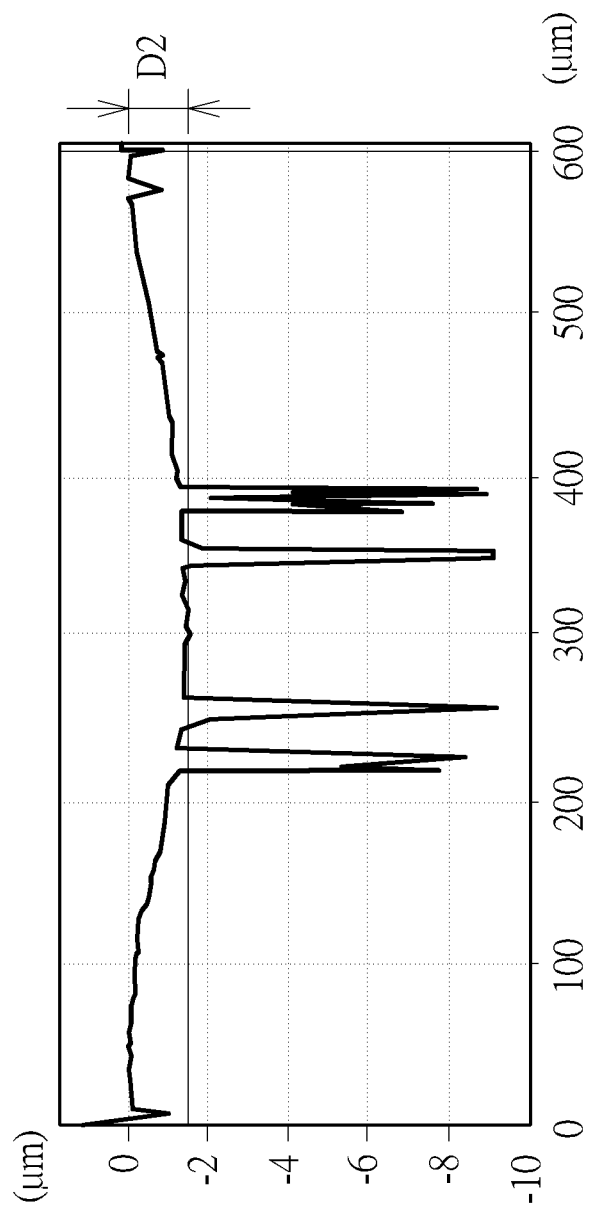
FIG. 7 is a broken line diagram demonstrating a relationship between depth and location along line A-A' of FIG. 1.

Please refer to FIG. 6 and FIG. 7. FIG. 7 is a broken line diagram demonstrating a relationship between depth and location along line A-A' of FIG. 1. In FIG. 7, the locations of troughs correspond to the locations of the spaces in the movable structure 111. Additionally, the measurement shown in FIG. 7 demonstrates that the top surface of the movable structure 111 is deformed gradually from the periphery of the movable structure 111 toward its center of which. As a result, the second distance D2 at the center of the movable structure 111 is often greater than that at the peripheral of the movable structure 111, which is bad for the performance of the MEMS device 110.

In the following paragraph, another way for fabricating an integrated device is disclosed. It should be noted that only differences among each embodiment are mentioned and like or similar features will usually be described with same reference numerals for ease of illustration and description thereof.

Figure 8:
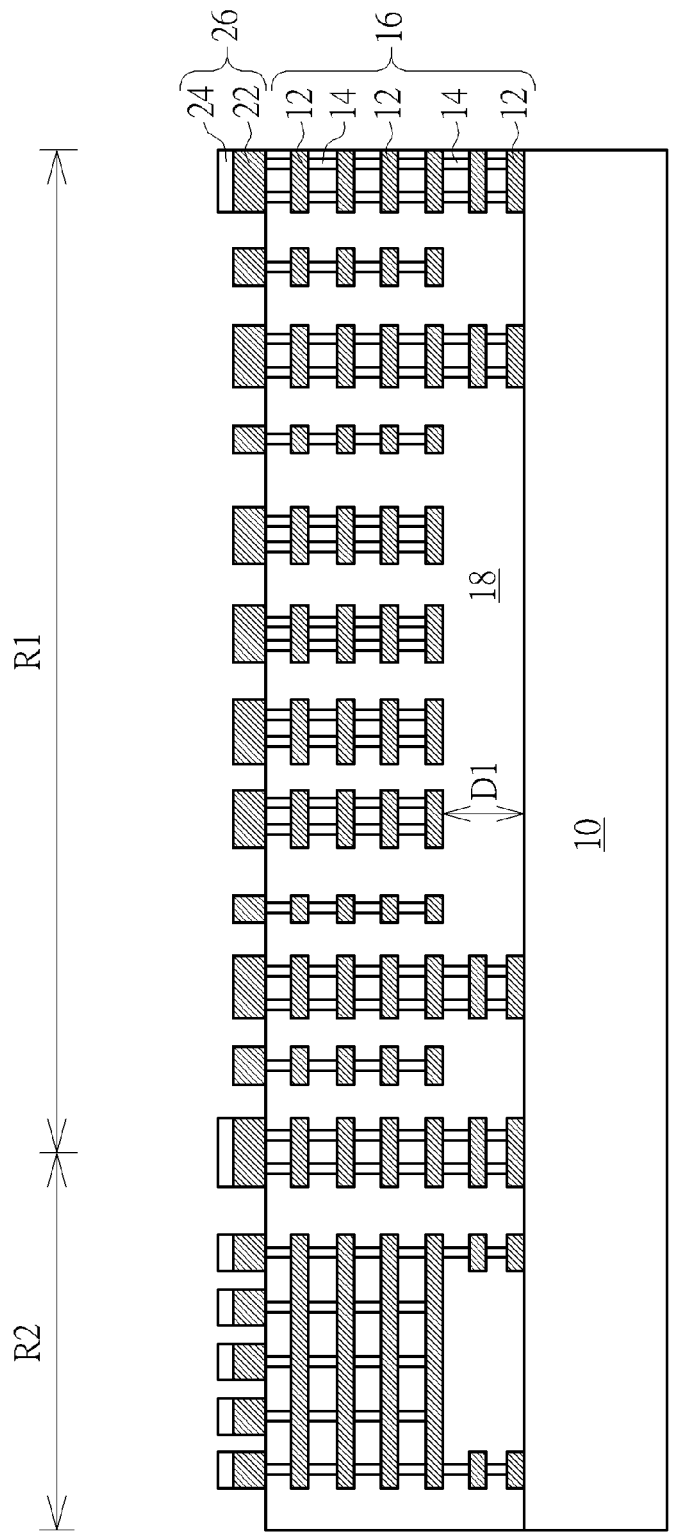
FIG. 8 to FIG. 9 are schematic cross sectional diagrams corresponding to a line A-A' of FIG. 1, which shows a method for fabricating the integrated device according to a second exemplary embodiment of the present invention.
Figure 9:
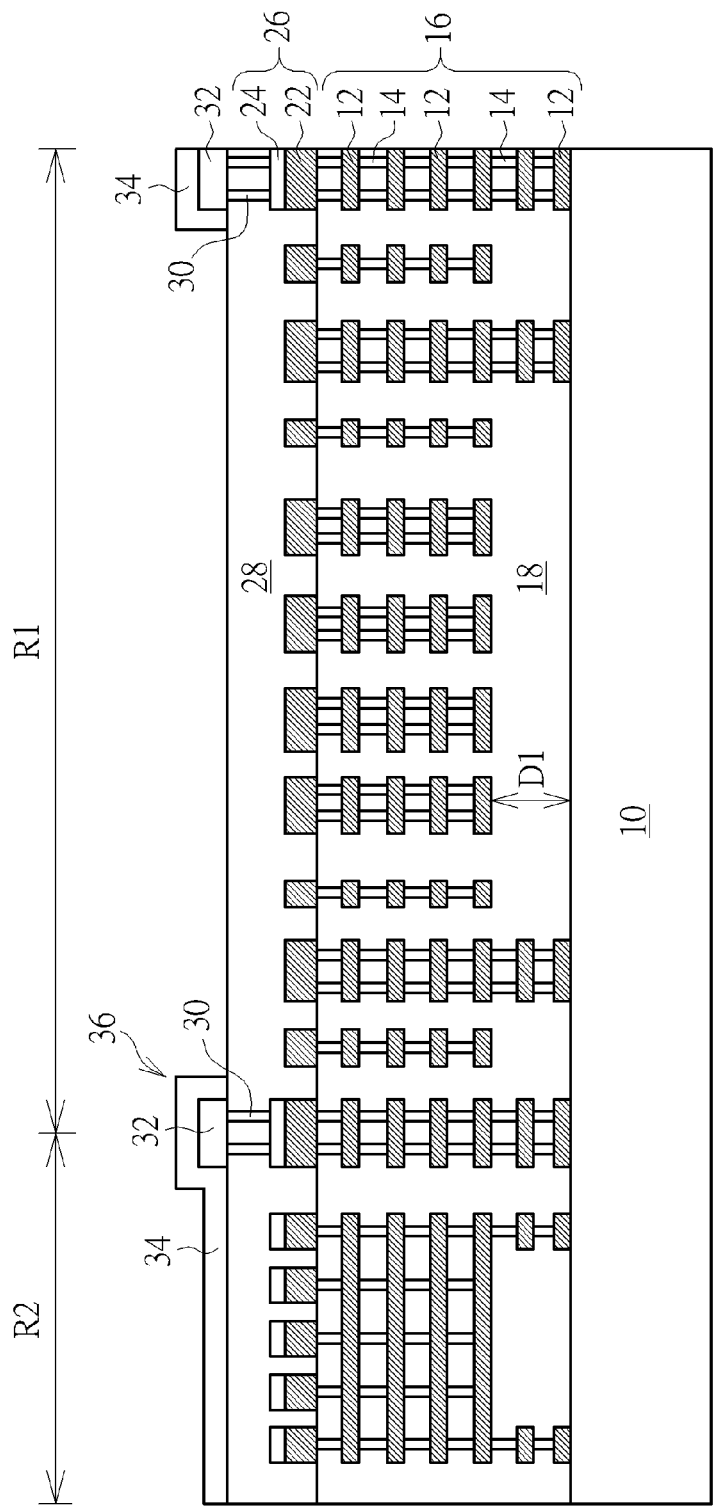

FIG. 8 to FIG. 9 are schematic cross sectional diagrams showing a method for fabricating the integrated device according to a second exemplary embodiment of the present invention. One main difference between the second exemplary embodiment and the first exemplary embodiment is the timing for removing the top conductive pattern. Please refer to FIG. 2 and FIG. 8, for example, after the formation of the structure shown in FIG. 2, an etching process is carried out to remove the top conductive pattern 24 within the MEMS region R1 so as to form a structure as shown in FIG. 8. In this way, the top surface of the bottom conductive pattern 22 within the MEMS region R1 can be exposed. Afterwards, processes similar to those disclosed in FIG. 3 to FIG. 4 are performed so as to obtain a structure shown in FIG. 9. In this configuration, the top surface of the bottom conductive pattern 22 within the MEMS region R1 is in direct contact with the upper isolation layer 28. More precisely, since the top conductive pattern within the MEMS region R1 is removed prior to the formation of the upper isolation layer 28, the stress supposed to be generated on the interface between the top conductive pattern and the bottom conductive pattern and memorized by the bottom conductive pattern can be avoided without doubt. In a next step, processes similar to those disclosed in FIG. 5 to FIG. 6 are performed so as to obtain a structure similar to that shown in FIG. 6. The surface topography of the finished structure is measured and depicted in the diagram shown in FIG. 10.

Figure 10:
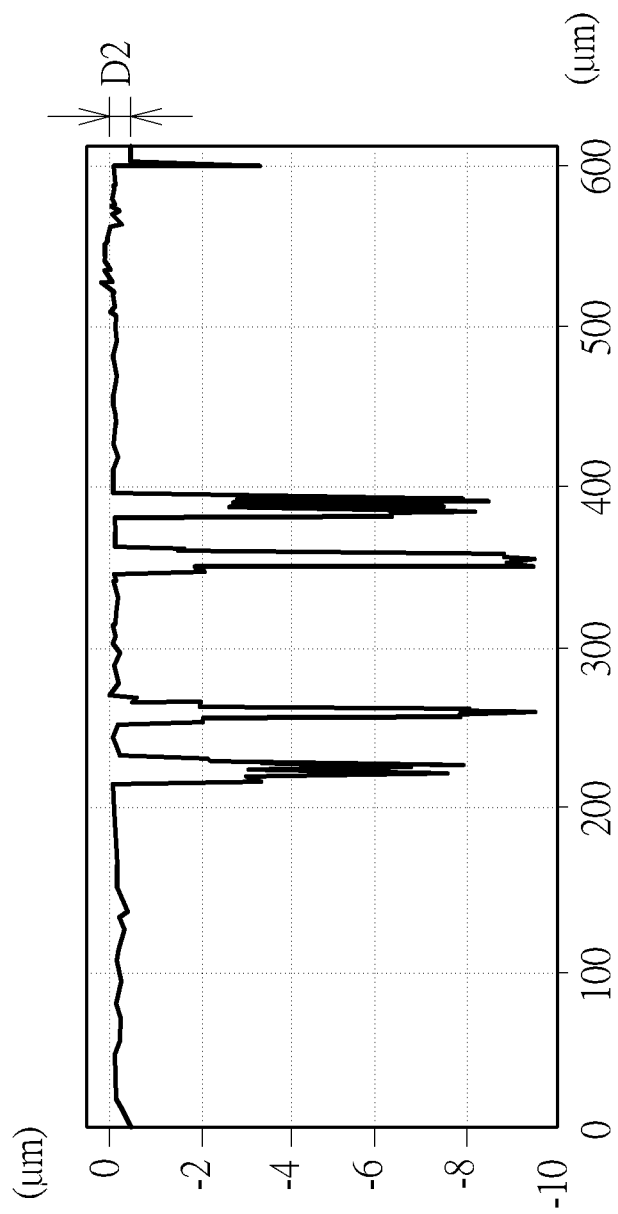
FIG. 10 is a broken line diagram demonstrating a relationship between depth and location along line A-A' of FIG. 1.

Please refer to FIG. 10. FIG. 10 is a broken line diagram demonstrating a relationship between depth and location along line A-A' of FIG. 1. In FIG. 10, the locations of troughs correspond to the locations of the spaces in the movable structure 111. Additionally, the measurement shown in FIG. 10 demonstrates that the top surface of the movable structure 111 is substantially flat from the periphery of the movable structure 111 to the center of which. As a result, the second distance D2 at the center of the movable structure 111 is almost equal to that at the peripheral of the movable structure 111.

To summarize, an integrated device including at least a MEMS device and at least a CMOS device is fabricated through the above-mentioned process. A top conductive pattern may be removed optionally prior to the deposition of the upper isolation layer. In this way, stress supposed to be generated at the interface between the top conductive pattern and the bottom conductive pattern and memorized by the bottom conductive pattern can be avoided without doubt. Accordingly, the performances and the reliability of the integrated device are improved.

It will be apparent to a person skilled in the art that the invention can be used in the fabrication of MEMS structures that can be utilized in different MEMS devices, including accelerometers, gyroscopes, electrical switches, movable mirrors, optical switches, add-drop multiplexers, optical radiation modulators, cantilevers with AFM tips, probe storage devices, micro-tweezers, precision MEMS-based positioning stages, electrostatic actuators, electromagnetic actuators, piezoelectric actuators, thermal actuators, valves, or other MEMS devices.

The disclosed embodiments can take the form of a fully hardware embodiment, or an embodiment containing both hardware and software elements for the manufacture of a MEMS device. In some embodiments, the disclosed arrangements can utilize softwares, which include, but not limited to, a firmware, a resident software, a microcode, or other softwares to assist in the manufacturing of the MEMS device. Furthermore, the invention can take the form of a computer program product accessible from a computer-usable or computer-readable medium providing a program code for use by, or in, connection with a computer or any instruction execution system. For the purposes of this description, a computer-usable or computer readable medium can be any apparatus that can contain, store, communicate, propagate, or transport the program for use by or in connection with the instruction execution system, apparatus, or device.

A computer can retrieve instructions from an electronic storage medium. The medium can be an electronic, magnetic, optical, electromagnetic, infrared, or semiconductor system (or apparatus or device) or a propagation medium. Examples of a computer-readable medium include a semiconductor or a solid state memory, a magnetic tape, a removable computer diskette, a random access memory (RAM), a read-only memory (ROM), a rigid magnetic disk or an optical disk. Current examples of optical disks include compact disks-read only memory (CD-ROM), compact disks-read/write (CD-R/W) and DVD. A data processing system suitable for storing and/or executing program code can include at least one processor, logic, or a state machine coupled directly or indirectly to memory elements through a system bus. The memory elements can include local memories employed during actual execution of the program code, bulk storage, and cache memories which provide temporary storage of at least some program code in order to reduce the number of times code must be retrieved from the bulk storage during execution.

Input/output, or I/O devices (including but not limited to keyboards, displays, pointing devices, etc.), can be coupled to the system either directly or through intervening I/O controllers. Network adapters may also be coupled to the system to enable the data processing system to become coupled to other data processing systems or remote printers or storage device through intervening private or public networks. Modems, cable modem and Ethernet cards are just a few of the currently available types of network adapters.

It will be apparent to those skilled in the art having the benefit of this disclosure that the present invention contemplates methods, systems, and media that can fabricate a MEMS device. It is understood that the form of the invention shown and described in the detailed description and the drawings are to be taken merely as examples. It is intended that the following claims be interpreted broadly to embrace all the variations of the example embodiments disclosed Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating an integrated device, comprising:
   providing a multi-layered structure on a substrate, wherein the multi-layered structure is embedded in a lower isolation layer;
   forming an upper conductive pattern on a top surface of the lower isolation layer, wherein the upper conductive pattern comprises a bottom conductive pattern and a top conductive pattern disposed on a top surface of the bottom conductive pattern;
   removing portions of the top conductive pattern to expose portions of the bottom conductive pattern;
   blank forming an upper isolation layer on the lower isolation layer, wherein the upper isolation layer is in direct contact with the portions of the bottom conductive pattern; and
   removing portions of the lower isolation layer and the upper isolation layer to expose portions of the substrate.

2. The method according to claim 1, wherein the multi-layered structure comprises:
   a plurality of lower conductive patterns; and
   a plurality of conductive vias, that are in contact and stacked alternately with the lower conductive patterns.

3. The method according to claim 1, wherein compositions of the lower isolation layer and the upper isolation layer comprises silicon oxide.

4. The method according to claim 1, wherein a composition of the bottom conductive pattern comprises aluminum.

5. The method according to claim 1, wherein a composition of the top conductive pattern is selected from a group consisting of titanium, titanium nitride, tantanum and tantanum nitride.

6. The method according to claim 1, further comprising forming a mask to cover portions of the upper isolation layer after forming the upper isolation layer.

7. The method according to claim 1, wherein the process of removing portions of the lower isolation layer and the upper isolation layer to expose portions of the substrate comprises a deep reactive ion etching (DRIE) process, a plasma etching process, a gas etching process, or a wet etching process.

8. The method according to claim 1, wherein the process of removing portions of the lower isolation layer and the upper isolation layer to expose portions of the substrate comprises utilizing HF vapor etching process.

9. The method according to claim 1, wherein the integrated device comprises a complementary metal oxide semiconductor (CMOS) region and a micro electro mechanical system (MEMS) region.

10. The method according to claim 9, further comprising forming a mask layer to cover the upper isolation layer within the CMOS region.

11. The method according to claim 9, further comprising forming at least a conductive via in the upper isolation layer, wherein the conductive via is connected to the top conductive pattern on an interface between the CMOS region and the MEMS region.

12. The method according to claim 9, wherein the top conductive pattern in the CMOS region is kept after the removing the portions of the top conductive pattern.

13. The method according to claim 9, wherein the top conductive pattern in the MEMS region is removed completely after removing the portions of the top conductive pattern.

14. The method according to claim 9, wherein the portions of the substrate is in the MEMS region.

15. The method according to claim 1, wherein removing the portions of the lower isolation layer and the upper isolation layer to expose the portions of the substrate forms at least a suspension structure, a frame connected to the suspension structure, and a movable structure connected to the frame.

16. The method according to claim 15, wherein the suspension structure further comprises:
   a fixed anchor, attached to the substrate; and
   a suspension spring, attached to the fixed anchor.

17. The method according to claim 15, wherein the movable structure is compliant in at least two mutually orthogonal directions.

18. The method according to claim 15, wherein the movable structure comprises a proof mass and a plurality of sense fingers.

19. The method according to claim 15, wherein the movable structure comprises an accelerometer, a gyroscope, an electrical contact, a mirror, an optical switch, a add-drop multiplexer, an optical radiation modulator, a cantilever with AFM tip, a probe storage device, a micro-tweezers, a precision MEMS-based positioning stage, an electrostatic actuator, an electromagnetic actuator, a piezoelectric actuator, a thermal actuator, or a valve.

* * * * *